US006762067B1

(12) United States Patent
Quinones et al.

(10) Patent No.: US 6,762,067 B1
(45) Date of Patent: Jul. 13, 2004

(54) METHOD OF PACKAGING A PLURALITY OF DEVICES UTILIZING A PLURALITY OF LEAD FRAMES COUPLED TOGETHER BY RAILS

(75) Inventors: Maria Clemens Y. Quinones, Cebu (PH); Gilmore S. Baje, Lapulapu (PH); Maria Christina B. Estacio, Cebu (PH); Marvin R. Gestole, Lapulapu (PH); Oliver M. Ledon, Lapulapu (PH); Santos E. Mepieza, Mandaue (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/487,969

(22) Filed: Jan. 18, 2000

(51) Int. Cl.⁷ .......................... H01L 21/48; H01R 43/00
(52) U.S. Cl. ............................ 438/11; 438/123; 29/827
(58) Field of Search ........................ 361/723, 772–774, 361/813; 29/827; 438/110, 111, 112, 123, 124, 126, 127; 257/666, 668, 672, 673, 676

(56) References Cited

U.S. PATENT DOCUMENTS

| | | | | |
|---|---|---|---|---|
| 3,839,782 A | * | 10/1974 | Lincoln ......................... 29/588 |
| 4,796,078 A | * | 1/1989 | Phelps, Jr. et al. ........... 257/668 |
| 5,365,106 A | * | 11/1994 | Watanabe ..................... 257/669 |
| 5,394,751 A | * | 3/1995 | Ishibashi ...................... 257/676 |
| 5,420,459 A | * | 5/1995 | Kozono ......................... 257/666 |
| 5,814,884 A | * | 9/1998 | Davis et al. .................. 257/723 |
| 5,939,779 A | * | 8/1999 | Kim ............................. 257/692 |
| 6,040,626 A | * | 3/2000 | Cheah et al. ................. 257/735 |
| 6,249,041 B1 | * | 6/2001 | Kasem et al. ................ 257/666 |
| 6,307,755 B1 | * | 10/2001 | Williams et al. ............ 361/813 |
| 6,423,623 B1 | * | 7/2002 | Bencuya et al. ............. 438/612 |

FOREIGN PATENT DOCUMENTS

| | | | |
|---|---|---|---|
| JP | 5-206354 | * | 8/1993 |
| JP | 6-140548 | * | 5/1994 |
| JP | 7-221236 | * | 8/1995 |
| JP | 11-312781 | * | 11/1999 |
| JP | 2000133676 | * | 5/2000 |
| KR | 2001 76670 | * | 8/2001 |
| KR | 2001 9329 | * | 2/2002 |

* cited by examiner

Primary Examiner—Alonzo Chambliss
(74) Attorney, Agent, or Firm—Townsend and Townsend and Crew LLP

(57) ABSTRACT

A method and arrangement for packaging a plurality of chip devices. The method includes providing a plurality of bottom leadframes coupled together with rails to form a bottom leadframe assembly and providing a plurality of top leadframes coupled together with rails to form a top leadframe assembly. Dies are placed between the top and bottom leadframes and the top and bottom leadframe assemblies are coupled to one another. The dies are attached to die attach pads of the bottom leadframes and are coupled to the top leadframes with solder bumps. A molded body is placed around the top and bottom leadframes with the dies therebetween and the rails are removed from the top and bottom leadframes, thus providing a plurality of chip devices.

27 Claims, 8 Drawing Sheets

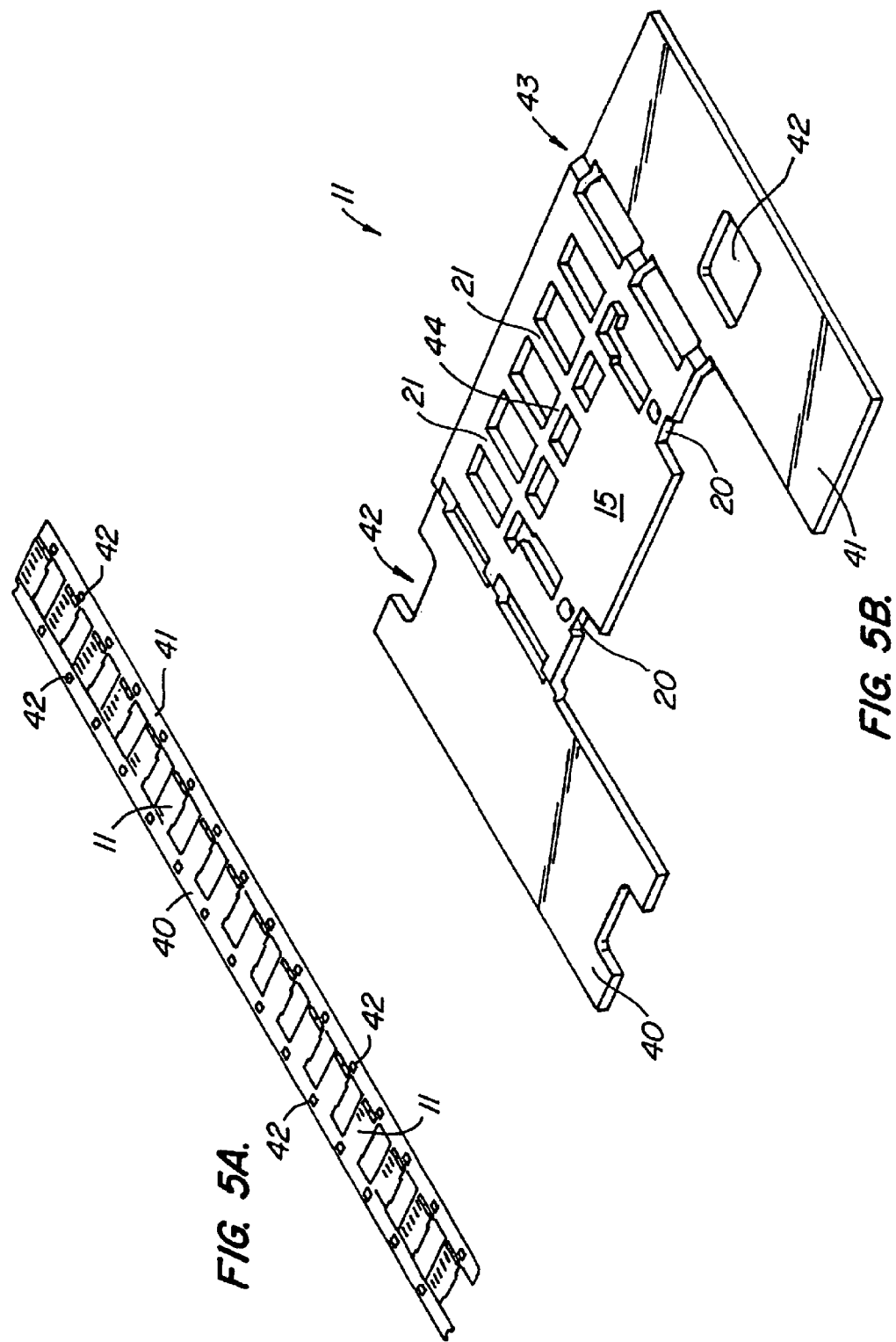

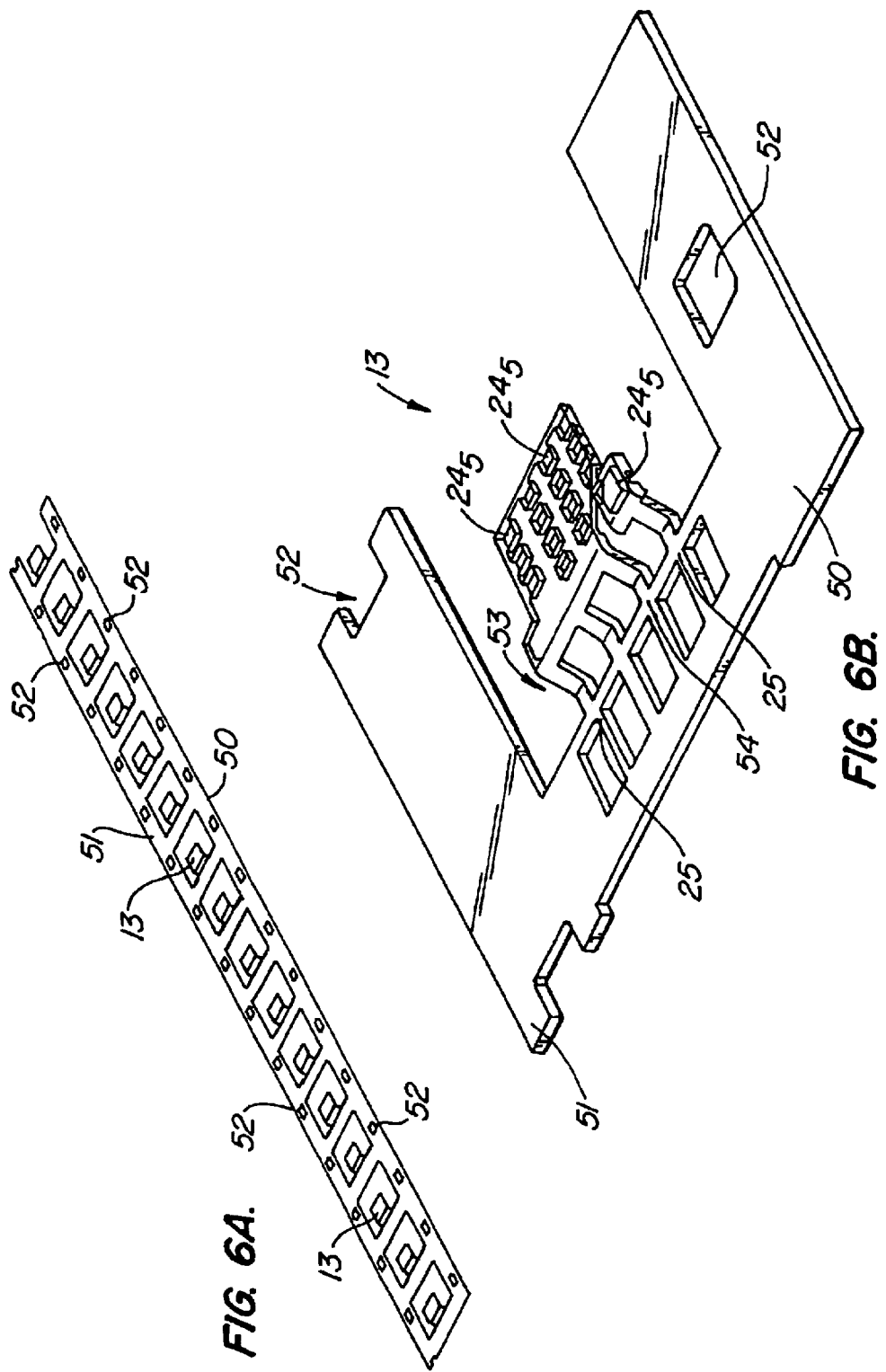

METHOD OF PACKAGING A PLURALITY OF DEVICES UTILIZING A PLURALITY OF LEAD FRAMES COUPLED TOGETHER BY RAILS

BACKGROUND OF THE INVENTION

1. Field of the Invention

The present invention relates to an improved method of making a chip device, and more particularly, an improved method of packaging a plurality of DMOS devices and an arrangement for making a plurality of DMOS devices.

2. Description of the Prior Art

Semiconductor power switching devices, and particularly, power MOSFET devices continue to push the lower limits of on-state resistance. While silicon process technology has advanced significantly in the past decade, essentially the same decades old package technology continues as the primary packaging means. Epoxy or soldered die attach along with aluminum or gold wire interconnects is still a preferred power device package methodology.

Recently, chip devices have been manufactured and packaged by connecting the chip within the device to the leads directly through a low resistance solder connection. By using a second leadframe element and solder to connect the device conductors and the first leadframe, a direct connection is enabled. Furthermore, the size and shape of the second leadframe may be tailored to fit the chip device and to minimize its electrical and thermal resistance.

Thus, it is desirable to provide a method and arrangement for making such "wireless" packaging of chip devices manufacturable in a high volume production environment.

SUMMARY OF THE INVENTION

In accordance with one aspect of the present invention, a method of making a plurality of DMOS devices includes providing a plurality of bottom leadframes coupled to one another with a pair of rails, attaching a corresponding bumped die including a plurality of solder bumps thereon including a source and gate array to each bottom leadframe, and placing a plurality of top leadframes on the bumped dies such that each top leadframe contacts solder bumps on a corresponding bumped die, the plurality of top leadframes being coupled to one another with a pair of rails.

In accordance with another aspect of the present invention, the method further includes placing a molded body around each top and bottom leadframe with a corresponding bumped die therebetween.

In accordance with another aspect of the present invention, the method includes spot welding a rail at the bottom leadframe and a rail of the top leadframe together.

In accordance with a further aspect of the present invention, the method includes pressfitting a rail on the bottom leadframe and a rail on the top leadframe together.

In accordance with yet another aspect of the present invention, the bumped die is attached to the bottom leadframe with an adhesive wherein the adhesive is cured sometime during the method after the bumped die is attached thereto.

In accordance with a further aspect of the present invention, a plurality of DMOS devices includes a plurality of bottom leadframes that each contain a plurality of leads, a plurality of bumped dies, each bumped die being on a corresponding bottom leadframe and including a source and gate array, and a plurality of top leadframes, each top leadframe being coupled to a corresponding bumped die and including a plurality of leads. The plurality of DMOS devices further includes four rails, a first rail being connected to a first side of each of the top leadframes, a second rail being connected to a second side of each of the top leadframes, a third rail being connected to a first side of each of the bottom leadframes, and a fourth rail being connected to a second side of each of the bottom leadframes. The bottom leadframe has leads coupled to drain terminals on the bumped die, the top leadframe has a lead coupled to a gate terminal on the bumped die, and leads coupled to source terminals on the bumped die, and the first rail is coupled to the third rail while the second rail is coupled to the fourth rail.

Thus, the present invention provides a method for packaging "wireless" chip devices in a high volume production environment. The method provides improved heat dissipation, excellent lead co-planarity control, low lead stress trim and form process, no loose metals at the trim and form process, unidirectional mold gating for better cavity fill and less compound flow turbulence, better manufacturability, and a flexible bumped die attach process.

Other features and advantages of the present invention will be understood upon reading and understanding the detailed description of the preferred exemplary embodiments, found hereinbelow in conjunction with reference to the drawings in which like numerals represent like elements.

BRIEF DESCRIPTION OF THE DRAWINGS

FIG. 5A is a schematic illustration of a bottom leadframe assembly for use in making chip devices in accordance with the present invention;

FIG. 5B is a perspective view of a bottom leadframe of the bottom leadframe assembly illustrated in FIG. 5A;

FIG. 6A is a schematic illustration of a top leadframe assembly for use in making chip devices in accordance with the present invention;

FIG. 6B is a perspective view of a top leadframe of the top leadframe assembly illustrated in FIG. 6A;

DETAILED DESCRIPTION OF THE PREFERRED EXEMPLARY EMBODIMENTS

Figure 1:
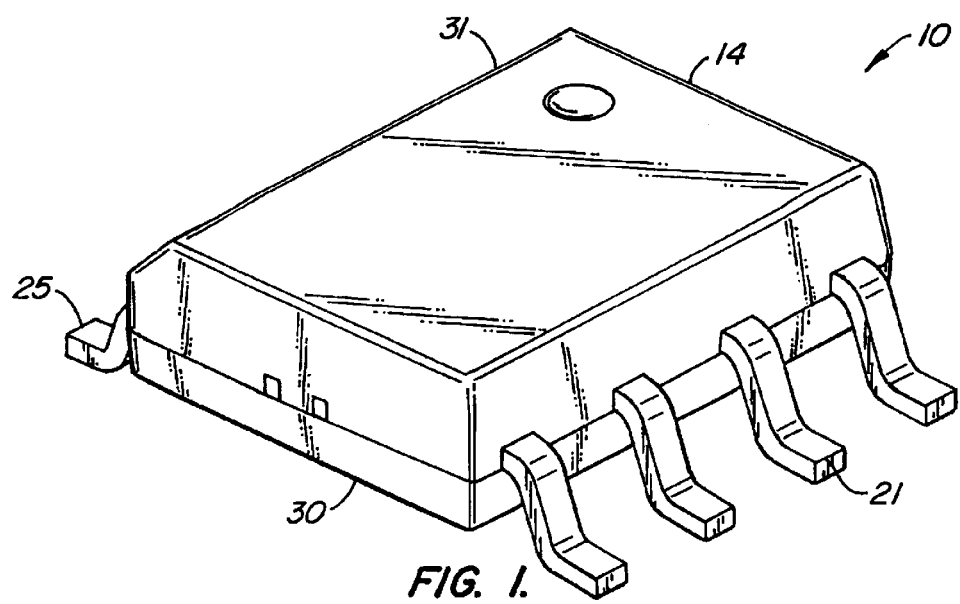
FIG. 1 is a perspective view of a chip device made in accordance with the present invention.

In accordance with the present invention, a chip device 10 includes a bottom leadframe 11, a die 12, a top leadframe 13 and a molded body 14 that surrounds most of the leadframes with the die therebetween.

The bottom leadframe generally includes a die attach pad 15. The die attach pad is generally supported by tie bars 20 and a plurality of leads 21 that generally serve as the drain terminals. In a preferred embodiment, there are four leads. The bottom leadframe is preferably made of a copper alloy and the die attach pad is preferably plated with one of either Ag or Ni.

The die is preferably attached to the die attach pad with Ag-filled adhesives or soft solder 27. Examples of Ag-filled adhesives include epoxy and polyimide. The die includes a source and gate array along its top surface.

Generally, solder bumps 22 are placed on the top surface of the die. Preferably, the top surface of the die includes locations 23 defined therein for receiving the solder bumps. Preferably, the solder bumps are one of alloys that include Pb/Sn, Pb/Sn/Ag, Sn/Sb or an equivalent. Generally, each solder bump has a diameter of approximately 0.008 inches and a height of 0.006 inches.

Figure 1A:
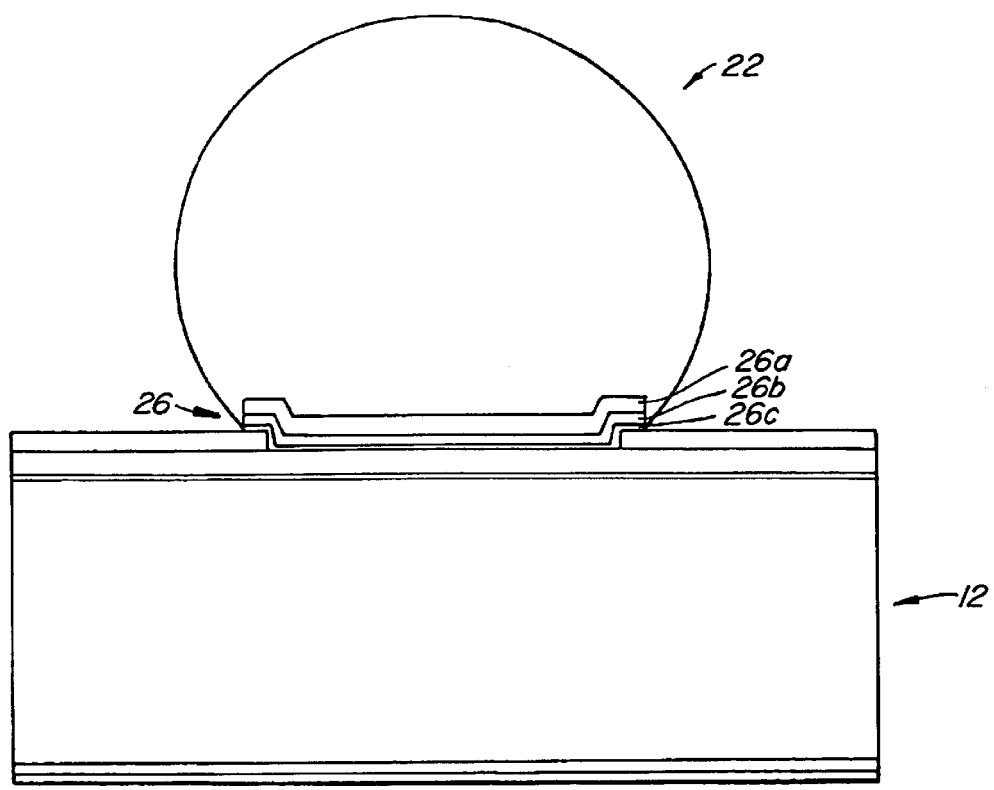
FIG. 1A is a schematic side sectional view of a bumped die.
Figure 2A:
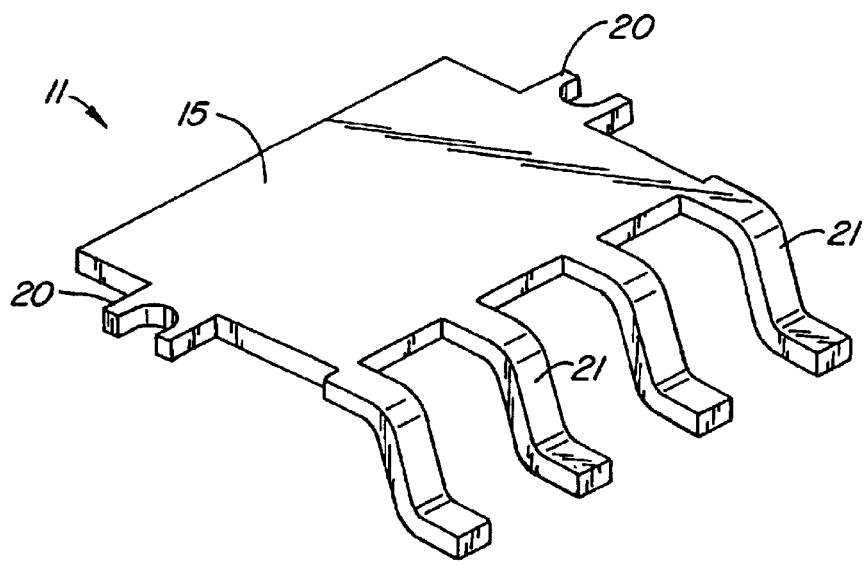
FIG. 2A is a perspective view of a bottom leadframe for use in making a chip device in accordance with the present invention.
Figure 2B:
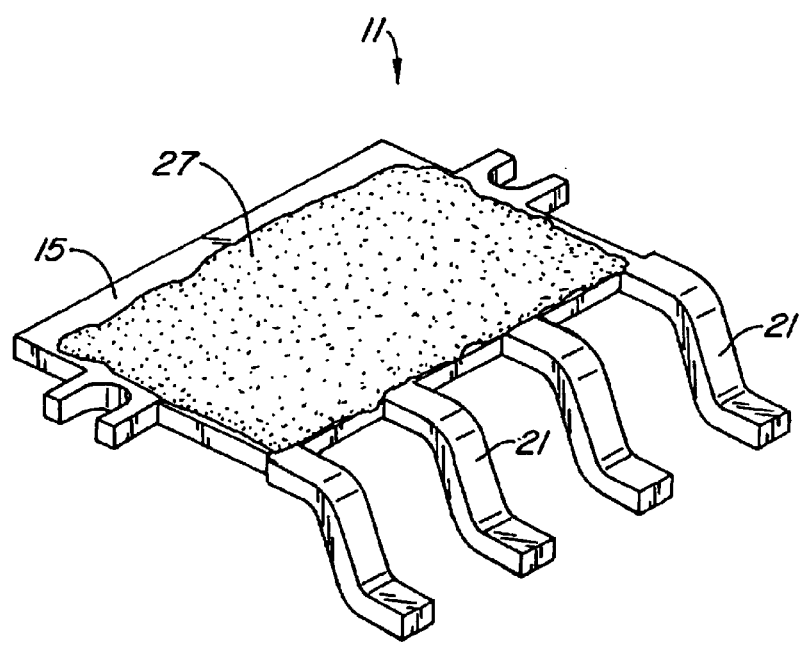
FIG. 2B is a perspective view of a bottom leadframe with die attach material thereon.

Die 12 is preferably a one-piece item that is often referred to in the art as "bumped die." As can be seen in FIG. 1A, a bumped die includes die 12, "under bump material" that serves an intermediated layer 26 between the top surface of the die and solder bump 22, and the solder bumps themselves. Preferably, the under bump material is one of TiW, Cu, Au or an equivalent. In the example illustrated in FIG. 1A, the under bump material is broken into three layers-Cu plating 26*a*, sputtered Cu 26*b* and sputtered Ti 26*c*.

The top leadframe includes a plurality of pad protrusions 24 that are coupled to corresponding leads 25. Some of the pads are source pads 24*s* for engaging the source array on the die while one of the pads is a gate pad 24*g* for coupling to the gate area on the die.

The molded body generally consists of two pieces 30, 31, each having a length of approximately 0.193 inches, a width of 0.154 inches and, a combined height of 0.057 inches.

In accordance with present invention, a plurality of bottom leadframes 11 are coupled together with a pair of rails 40, 41 to form a bottom leadframe assembly as illustrated in FIG. 5A. FIG. 5B illustrates a typical bottom leadframe and how it is coupled between the two rails. The rails provide mechanical support for the bottom leadframe during the manufacturing process.

As noted previously, each bottom leadframe includes a die attach pad that provides connection to the drain of the die. Drain leads 21 are provided for connection of the drain to the die. A tie bar is provided for die attach pad support and package support at the early stages of forming the chip devices. A dambar 44 is also provided and serves as a mold flash barrier. A rail "up" set is provided as seen at 43 and levels drain leads 21 with gate and source leads 25 of a corresponding top leadframe. Preferably, at least one rail is provided with an index/alignment hole 42 for aligning the top and bottom leadframes and for use in transporting the rails during the manufacturing process. As can be seen in the figures, the index/alignment holes of rail 40 are preferably offset with respect to the index/alignment holes of rail 41.

With regard to FIG. 6A, a plurality of top leadframes 13 coupled to one another between two rails 50, 51 to form a top lead frame assembly is illustrated. FIG. 6B illustrates a typical top leadframe coupled between the two rails. The rails provide mechanical support of the top leadframe during the manufacturing process.

As noted previously, each top leadframe includes a source pad that includes terminals for connecting to source metalizations on the die and a gate pad for connecting one terminal to the gate metalization of the die. The pads each include contact protrusions for providing good contact between solder bumps of the die and the source/gate pads. The pads are in communication with corresponding leads 25. Once again, a dambar 54 is provided that serves as a mold flash barrier and support for the leads coplanarity. Each top leadframe also includes a lead "up" set as seen at 53 that provides space for the solder bumped die and for leveling the gate and source leads 25 with the drain leads 21 of the bottom leadframe. Index/alignment holes 52 are preferably provided in the rails to help ensure proper alignment between the rails of the top lead frame assembly and the rails of the bottom leadframe assembly. So that the alignment is proper, the index/alignment holes of rail 51 are offset with respect to the index/alignment holes of rail 50. As should be readily apparent, the index/alignment holes of rail 40 align with the index/alignment holes of rail 51 while the index/alignment holes of rail 41 align with the index/alignment holes of rail 50 during the manufacturing process.

Figure 7:
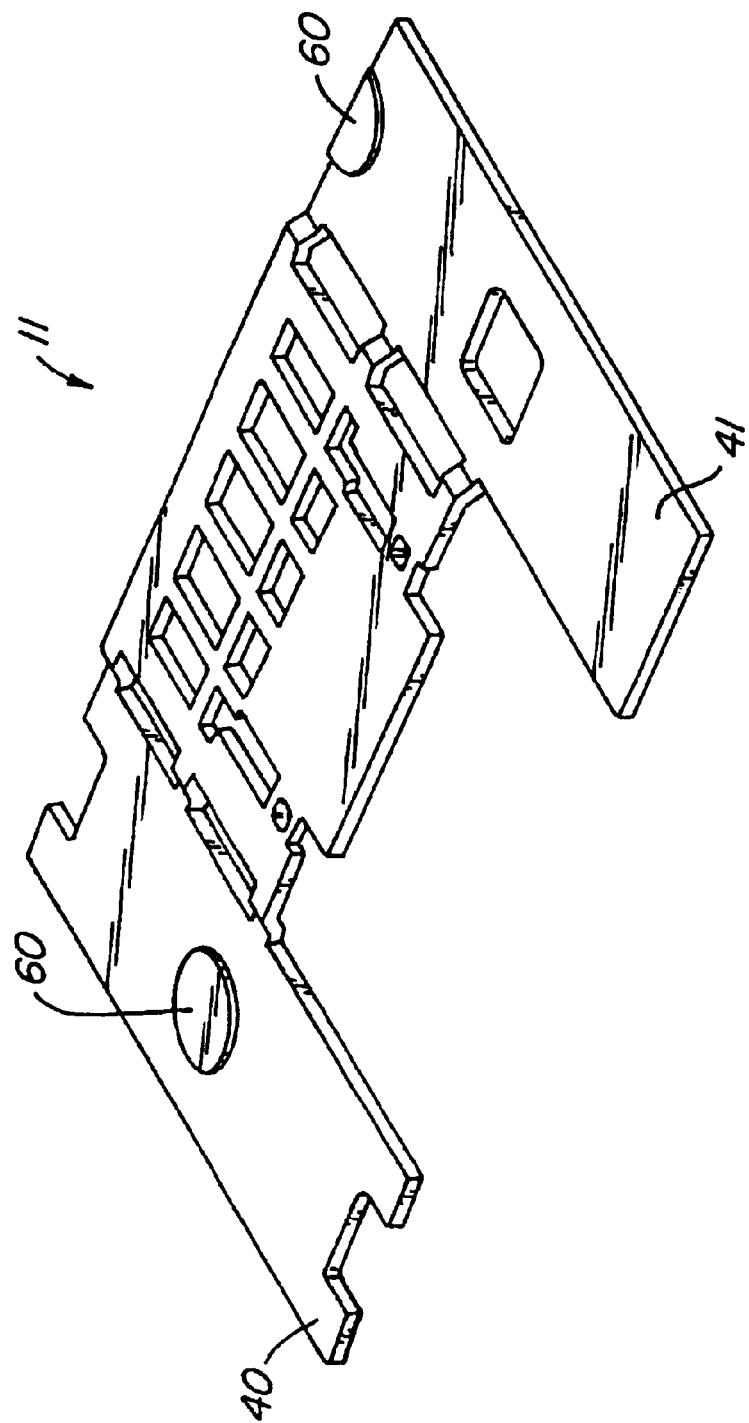
FIG. 7 is a perspective view of a bottom leadframe of the bottom leadframe assembly illustrated in FIG. 5B, including bottom frame aligners.
Figure 8:
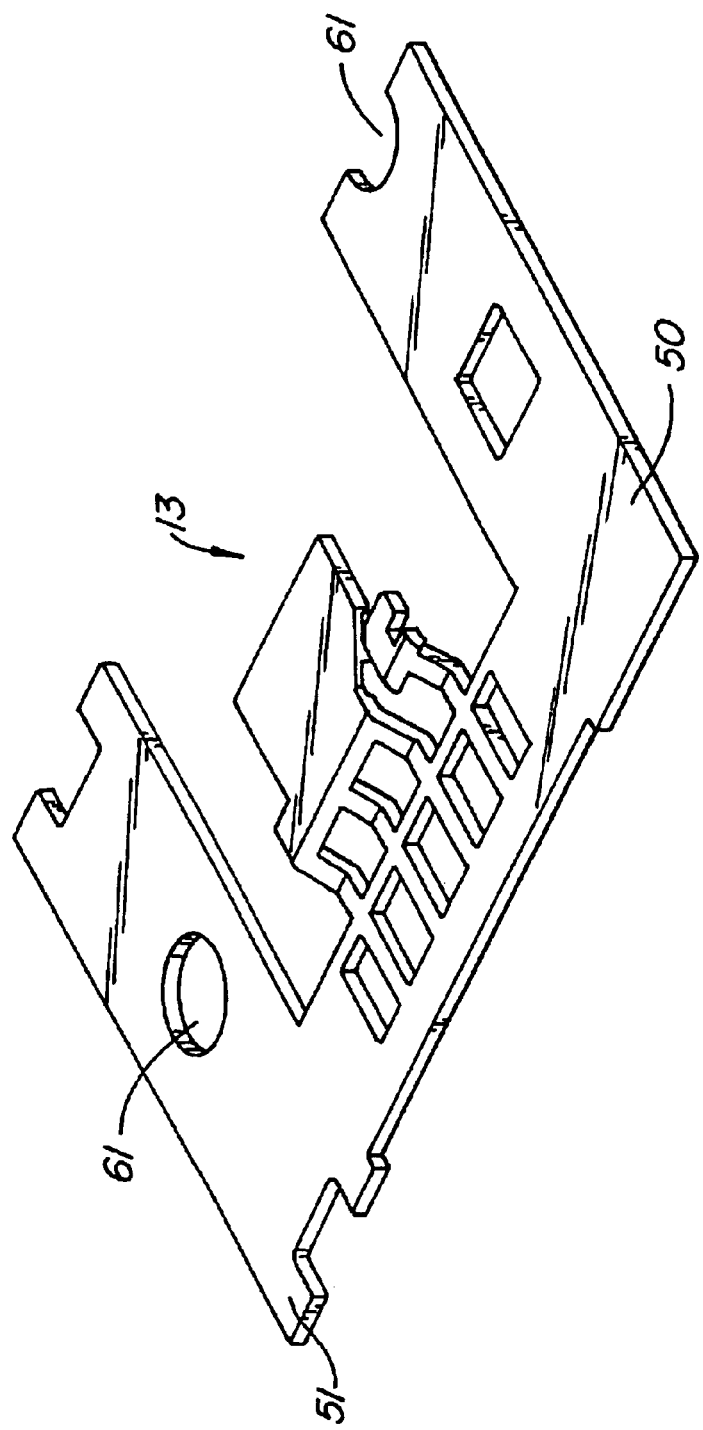
FIG. 8 is a top leadframe from the top leadframe assembly illustrated in FIG. 6B, including top frame aligners.

The rails of the two leadframes may include an easy-align feature to aid in aligning the index/alignment holes. The bottom frame aligners 60 are located on the bottom leadframe rails as illustrated in FIG. 7. They may be of any suitable shape and size. Preferably, the bottom frame aligners protrude on the rail surface by approximately 50% to 75% of the leadframe thickness. Corresponding holes 61 are defined within the rails of the top leadframe assemblies and serve as top frame aligners as illustrated in FIG. 8. These holes are of the same shape and size as the bottom frame aligners and are located on the same center lines as the bottom frame aligners. The bottom frame aligners are then pressfitted into the top frame alignment holes keeping both leadframe assemblies coupled to one another.

Alternatively, the rails of the leadframe assemblies may be spot welded near the location of the aligners. In such an embodiment, the aligners would not be of any particular shape but rather, would mark where the rails are to be spot welded to one another, or may be eliminated altogether.

Figure 3A:
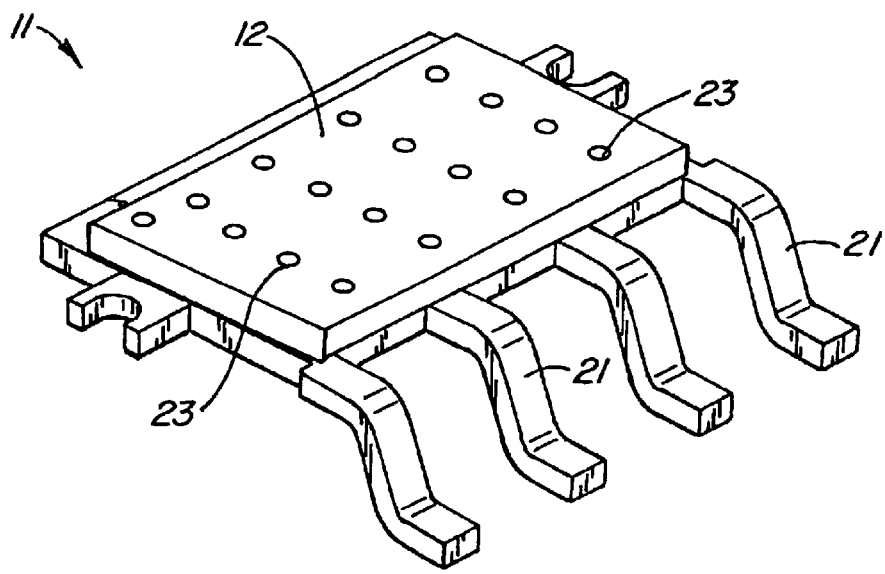
FIG. 3A is a perspective view of a bottom leadframe with a die placed thereon.
Figure 3B:
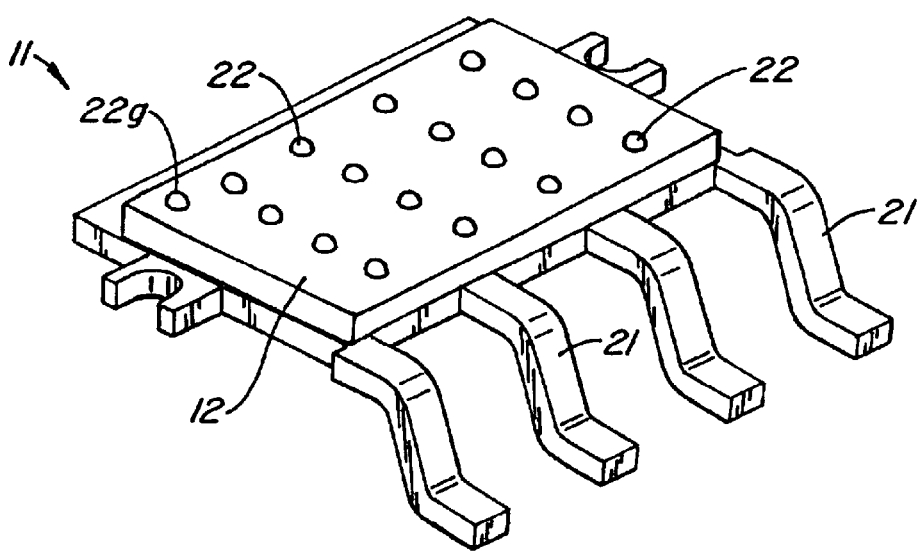
FIG. 3B is a perspective view of the bottom leadframe and die of FIG. 3A with solder bumps added thereon.
Figure 4A:
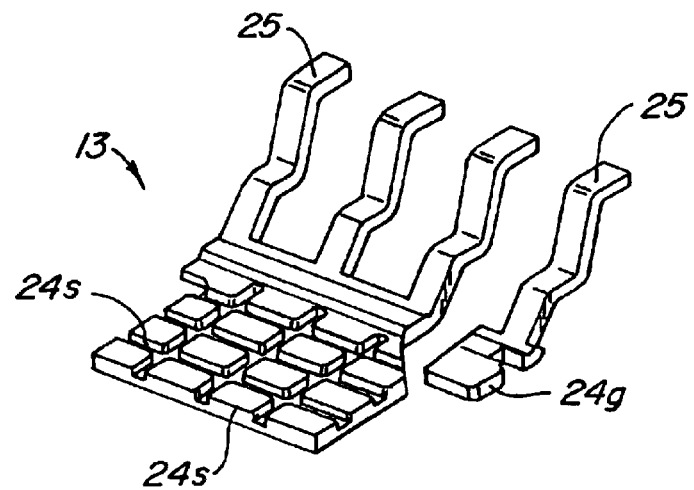
FIG. 4A is a perspective view of an inverted top leadframe for use in making a chip device in accordance with the present invention.
Figure 4B:
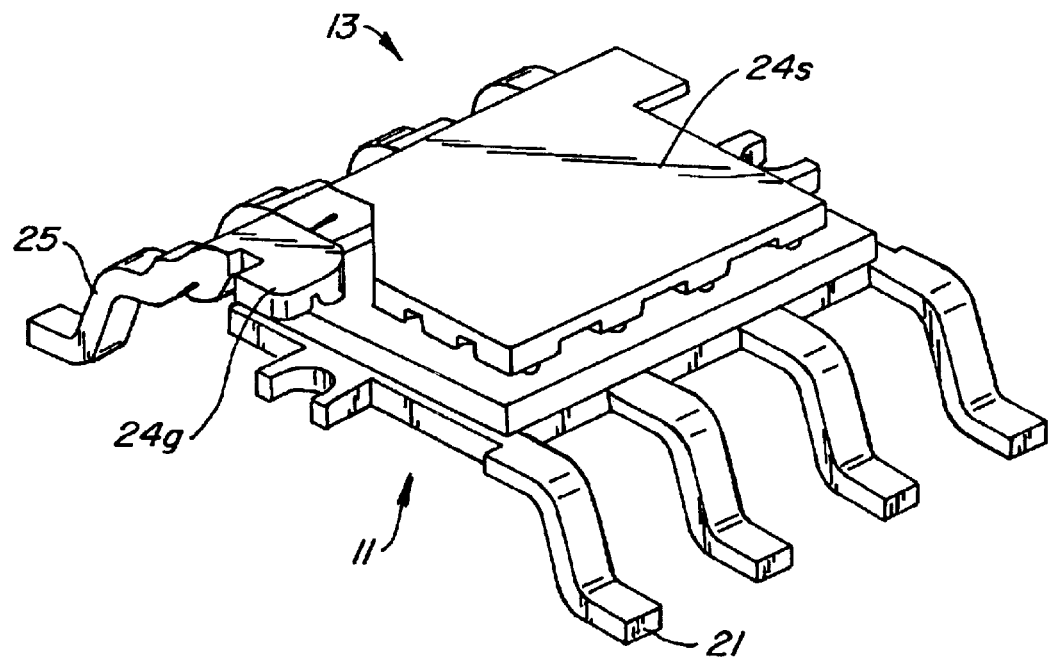
FIG. 4B is a perspective view of the top leadframe placed on the bottom leadframe with the die and solder bumps therebetween.

In accordance with one embodiment of the present invention, a plurality of chip devices is manufactured by providing a bottom leadframe assembly. A bumped die 12 is placed on each die attach pad of each bottom leadframe and is attached thereto with epoxy. Generally, the bumped die will be required to be placed with approximately ±2 mils accuracy. The epoxy is cured, such as, for example, by conventional box oven curing or heater block snap curing. As can be seen in FIG. 3B, the solder bumps are in a row with one of the solder bumps slightly offset. This offset solder bump 22*g* corresponds to the gate area of the die. The top leadframe assembly receives flux (or is "fluxed") on its pads and is then flipped onto the bottom leadframe assembly such that a source pad and gate pad of each top leadframe engages a corresponding solder bump die gate and source array. Preferably, the rails of the top leadframe and the rails of the bottom leadframe are spot welded together. Other forms of coupling the rails of the top leadframe to the rails of the bottom leadframe may be used, including, for example, pressfitting.

The coupled top and bottom leadframe assemblies are then heated to reflow the solder bumps and permanently attach each die to its corresponding top leadframe.

In an alternative embodiment, the bumped die is attached to the die attach pad with an epoxy.

In another alternative embodiment, the top leadframe assembly is fluxed. Bumped dies 12 are then flipped from their pickup positions and attached to the top leadframes so that the source and gate arrays engage the source and gate pads. Once again, the die placement precision requirement is preferably ±2 mils. The flipped dies and top leadframe assemblies are heated to reflow the solder bumps and permanently attach the dies to the top leadframes. Low melting solder paste or epoxy is dispensed on each die attach pad of the bottom leadframes and the top leadframe assembly is then flipped over onto the bottom leadframe assembly so that each die is attached to a corresponding die attach pad of a bottom leadframe. Preferably, the entire assembly is done on a heated block. Alternatively, the completed assembly may be cured in a conventional box oven. The top and bottom leadframe rails are preferably spot welded together.

Alternatively, any of the above methods may be performed with the fluxing being performed directly on the solder bumps of the bumped dies instead of the top leadframes. Additionally, the bottom leadframe assembly may be flipped onto the top leadframe assembly.

Each of the above methods are preferably preformed on a pick and place machine, or a similar type machine, as is known in the industry. Generally, the top and bottom leadframe assemblies will be positioned and held in place by the alignment/index holes.

Additionally, each of the above methods include placing a molded body around the "sandwiched leadframe assemblies." The dambars and mold flashes are mechanically removed and any remaining resin bleeds on the leads are removed using pressurized media to deflash grits. If desired, laser marking or marking with ink is preformed on a top surface of the molded bodies in order to identify the parts. Rack plating is then performed and the individual chip devices are removed from the frames and rails with the leads being trimmed and formed. Preferably, the trim and form is preformed with a three stage forming process as is known in the art.

Each of the top leadframes preferably includes slots defined in the source and gate pads to facilitate a good contact and alignment with the solder bumps between the die and the top leadframe. These slots also provide a sufficient mold plastic path. Alternatively, the top leadframes may include punch-through holes as opposed to slots.

Accordingly, the present invention provides methods by which "wireless" packaging is made manufacturable in a high volume production environment. The methods allow for improved heat dissipation, excellent lead coplanarity control, low lead stress trim and form process, reduced loose metals during the trim and form process and overall better manufacturability.

Although the invention has been described with reference to specific exemplary embodiments, it will appreciated that it is intended to cover all modifications and equivalents within the scope of the appended claims.

What is claimed is:

1. A method of making a chip device, the method comprising:
   providing a plurality of bottom leadframes coupled to one another with a pair of rails;
   attaching a corresponding bumped die including a source and gate solder bump array to each bottom leadframe;
   providing a plurality of top leadframes coupled to one another with a pair of rails; and
   flipping the plurality of top leadframes such that each top leadframe contacts the solder bumps on a corresponding bumped die.

2. A method in accordance with claim 1 further comprising placing a molded body around each top and bottom leadframe with a corresponding bumped die therebetween.

3. A method in accordance with claim 1 further comprising spot welding a rail of the bottom leadframe and a rail of the top leadframe together.

4. A method in accordance with claim 3 further comprising reflowing the solder bumps.

5. A method in accordance with claim 1 further comprising pressfitting a rail of the bottom leadframe and a rail of the top leadframe together.

6. A method in accordance with claim 5 further comprising reflowing the solder bumps.

7. A method in accordance with claim 1 wherein the bumped die is attached to the bottom leadframe with an adhesive, the adhesive being cured sometime during the method after the die is attached thereto.

8. A method in accordance with claim 1 wherein the bumped die is attached to the bottom leadframe with soft solder.

9. A method in accordance with claim 1 wherein the pair of rails coupling the bottom lead frames include aligners and the pair of rails coupling the top lead frames include corresponding holes, and wherein when the top lead frames are flipped onto the bottom lead frames, the aligners and holes are used to ensure proper alignment.

10. A method of making a plurality of chip devices, the method comprising:
    providing a plurality of top leadframes coupled to one another with a pair of rails;
    flipping a bumped die including a source and gate solder bump array on each top leadframe such that each bumped die contacts the gate and source pads of topframe; and
    providing a plurality of bottom leadframes being coupled to one another with a pair of rails;
    flipping the top leadframes onto the plurality of bottom leadframes such that a bumped die is between each top leadframe and a corresponding bottom leadframe.

11. A method in accordance with claim 10 further comprising placing a molded body around each top and bottom leadframe with a corresponding bumped die therebetween.

12. A method in accordance with claim 10 further comprising spot welding a rail of the bottom leadframe and a rail of the top leadframe together.

13. A method in accordance with claim 12 further comprising reflowing the solder bumps.

14. A method in accordance with claim 10 further comprising pressfitting a rail of the bottom leadframe and a rail of the top leadframe together.

15. A method in accordance with claim 14 further comprising reflowing the solder bumps.

16. A method in accordance with claim 10 wherein the die is attached to the bottom leadframe with soft solder.

17. A method in accordance with claim 10 wherein the die is attached to the bottom leadframe with an adhesive, the adhesive being cured sometime during the method after the die is attached thereto.

18. A method in accordance with claim 10 wherein the pair of rails coupling the bottom lead frames include aligners and the pair of rails coupling the top lead frames include corresponding holes, and wherein when the top lead frames are flipped onto the bottom lead frames, the aligners and holes are used to ensure proper alignment.

19. A method of making a plurality of chip devices, the method comprising:

provided a plurality of top leadframes coupled to one another with a pair of rails;

providing a plurality of bottom leadframes coupled to one another with a pair of rails, each bottom leadframe including a die attach pad;

placing a bumped die including a source and gate array on each die attach pad of each bottom leadframe; and coupling the top and bottom leadframe rails together such that each bumped die contacts the solder bumps of a corresponding top leadframe.

20. A method in accordance with claim 19 further comprising placing a molded body around each top and bottom leadframe with a corresponding bumped die therebetween.

21. A method in accordance with claim 19 further comprising spot welding the rails of the bottom leadframe and the rails of the top leadframe together.

22. A method in accordance with claim 21 further comprising reflowing the solder bumps.

23. A method in accordance with claim 19 further comprising pressfitting the rails of the bottom leadframe and the rails of the top leadframe together.

24. A method in accordance with claim 23 further comprising reflowing the solder bumps.

25. A method in accordance with claim 19 wherein each bumped die is attached to the bottom leadframe with an adhesive, the adhesive being cured sometime during the method after the die is attached thereto.

26. A method in accordance with claim 19 wherein each bumped die is attached to the bottom leadframe with soft solder.

27. A method in accordance with claim 19 wherein the pair of rails coupling the bottom lead frames include aligners and the pair of rails coupling the top lead frames include corresponding holes, and wherein when the top lead frames are flipped onto the bottom lead fines, the aligners and holes are used to ensure proper alignment.

* * * * *